(12) United States Patent
Nguyen et al.

(10) Patent No.: US 8,536,546 B2
(45) Date of Patent: Sep. 17, 2013

(54) CARBON NANOTUBE ELECTRON GUN

(75) Inventors: Cattien V. Nguyen, San Jose, CA (US); Bryan P. Ribaya, San Jose, CA (US)

(73) Assignee: Eloret Corporation, Sunnyvale, CA (US)

( * ) Notice: Subject to any disclaimer, the term of this patent is extended or adjusted under 35 U.S.C. 154(b) by 300 days.

(21) Appl. No.: 12/962,559

(22) Filed: Dec. 7, 2010

(65) Prior Publication Data

US 2011/0104976 A1    May 5, 2011

Related U.S. Application Data

(62) Division of application No. 11/811,674, filed on Jun. 11, 2007, now Pat. No. 7,847,273.

(60) Provisional application No. 60/921,134, filed on Mar. 30, 2007.

(51) Int. Cl.
   *H01J 9/12* (2006.01)
(52) U.S. Cl.
   USPC ............. 250/492.3; 250/492.1; 250/493.1; 250/494.1; 250/503.1; 313/309; 313/336; 977/742
(58) Field of Classification Search
   USPC .......... 250/491.1, 492.1, 492.3, 493.1, 494.1, 250/503.1, 396 R; 313/309, 336; 977/742
   See application file for complete search history.

(56) References Cited

U.S. PATENT DOCUMENTS

| | | | | |
|---|---|---|---|---|
| 5,973,444 A | * | 10/1999 | Xu et al. | 313/309 |
| 6,930,313 B2 | * | 8/2005 | Fujieda et al. | 250/423 R |
| 7,847,273 B2 | * | 12/2010 | Nguyen et al. | 250/493.1 |
| 7,879,308 B1 | * | 2/2011 | Chow et al. | 423/447.8 |
| 2004/0026629 A1 | * | 2/2004 | Fujieda et al. | 250/423 R |
| 2004/0173378 A1 | * | 9/2004 | Zhou et al. | 174/260 |
| 2005/0092929 A1 | * | 5/2005 | Schneiker | 250/396 R |
| 2006/0184843 A1 | * | 8/2006 | Oakley | 714/100 |
| 2007/0148991 A1 | * | 6/2007 | Schwind et al. | 438/800 |
| 2008/0000773 A1 | * | 1/2008 | Lee et al. | 204/471 |
| 2008/0251735 A1 | * | 10/2008 | Putterman et al. | 250/424 |

* cited by examiner

*Primary Examiner* — Michael Logie
(74) *Attorney, Agent, or Firm* — Jeffrey K. Riddle; Van Cott, Bagley, Cornwall & McCarthy P.C.

(57) ABSTRACT

An electron gun, an electron source for an electron gun, an extractor for an electron gun, and a respective method for producing the electron gun, the electron source and the extractor are disclosed. Embodiments provide an electron source utilizing a carbon nanotube (CNT) bonded to a substrate for increased stability, reliability, and durability. An extractor with an aperture in a conductive material is used to extract electrons from the electron source, where the aperture may substantially align with the CNT of the electron source when the extractor and electron source are mated to form the electron gun. The electron source and extractor may have alignment features for aligning the electron source and the extractor, thereby bringing the aperture and CNT into substantial alignment when assembled. The alignment features may provide and maintain this alignment during operation to improve the field emission characteristics and overall system stability of the electron gun.

8 Claims, 12 Drawing Sheets

CARBON NANOTUBE ELECTRON GUN

RELATED APPLICATIONS

The present application is a divisional of U.S. patent application Ser. No. 11/811,674, filed Jun. 11, 2007, entitled "CARBON NANOTUBE ELECTRON GUN," naming Cattien V. Nguyen and Bryan P. Ribaya as inventors, assigned to the assignee of the present invention, which claims the benefit of U.S. Provisional Patent Application No. 60/921,134, filed Mar. 30, 2007, entitled "CARBON NANOTUBE ELECTRON GUN," naming Cattien V. Nguyen and Bryan P. Ribaya as inventors, assigned to the assignee of the present invention. Those applications are incorporated herein by reference in their entirety and for all purposes.

The present application is related to U.S. patent application Ser. No. 11/729,124, filed Mar. 27, 2007, entitled "CARBON NANOTUBE ELECTRON SOURCE," naming Cattien V. Nguyen as the inventor, assigned to the assignee of the present invention. That application is incorporated herein by reference in its entirety and for all purposes.

GOVERNMENT INTERESTS

The invention described herein was made by non-government employees, whose contributions were made in the performance of work under a NASA contract, and is subject to the provisions of Public Law 96-517 (35 U.S.C. §202). This invention was made with Government support under contract NAS2-03144 awarded by NASA. The Government has certain rights in this invention.

BACKGROUND OF THE INVENTION

A carbon nanotube (CNT) is one or more sheets of graphite rolled into a tube with a diameter on the order of a nanometer. Single-walled carbon nanotubes (SWNTs) consist of a single sheet of graphite with a thickness of roughly one atom, whereas multi-walled carbon nanotubes (MWNTs) consist of multiple sheets of graphite rolled into concentric tubes. In general, CNTs are an attractive option for electron emission given their robust physical, chemical and electrical properties. And in particular, CNTs perform well as cold field emitters due to their high aspect ratios providing low turn-on fields.

Given the robust properties of CNTs and their ability to emit electrons, CNTs can make very effective electron sources for electron field emission guns. However, the performance of the electron gun is dependent upon the implementation of the CNT within the electron gun, as well as the overall configuration of the electron gun itself. Most conventional electron guns utilize poor CNT implementation and electron gun configuration, and as such, exhibit poor field emission characteristics, stability, reliability, and durability.

For example, U.S. Pat. No. 7,151,268 to Fujieda et al. discusses a conventional electron gun using a conventional extractor to extract electrons from an electron source. The electron gun discussed in the '268 patent has no provision for aligning the CNT with the extractor, thereby requiring complex and expensive focusing electron optics. Additionally, the misalignment of the extractor and the CNT in conventional electron guns requires the use of large focusing electron optics. Accordingly, conventional electron guns cannot be used in many miniaturized applications.

SUMMARY OF THE INVENTION

Accordingly, a need exists to provide an improved electron source for use in electron guns. A need also exists for an improved extractor for use in electron guns. Additionally, a need exists to provide an electron gun with improved alignment of the carbon nanotube and extractor. Embodiments of the present invention provide novel solutions to these needs and others as described below.

Embodiments of the present invention are directed to an electron gun, an electron source for an electron gun, an extractor for an electron gun, and a respective method for producing the electron gun, the electron source and the extractor. More specifically, embodiments provide an electron source utilizing a carbon nanotube (CNT) bonded to a substrate for increased mechanical and electrical stability, reliability, and durability. An extractor with an aperture in a conductive material is used to extract electrons from the electron source, where the aperture may substantially align with the CNT of the electron source when the extractor and electron source are mated to form the electron gun. The electron source and extractor may have alignment features for aligning the electron source and the extractor, thereby bringing the aperture and CNT into substantial alignment when assembled. The alignment features may provide and maintain this alignment during operation to improve the field emission characteristics and overall system stability of the electron gun.

In one embodiment, an electron source includes a substrate and a conductive material disposed on the substrate. The electron source also includes a carbon nanotube coupled to the conductive material. The substrate may include a feature for accepting the carbon nanotube, and wherein the carbon nanotube is coupled to a portion of the conductive material disposed on the feature. The substrate may also include at least one alignment feature for aligning the carbon nanotube with an extractor aperture of the electron gun.

In another embodiment, a method of producing an electron source includes etching a substrate to create a feature for accepting a carbon nanotube. A conductive material is applied to the substrate. The carbon nanotube may be coupled to a portion of the conductive material disposed on the feature. The coupling may include applying an electric potential between the carbon nanotube and the conductive material, and also welding the carbon nanotube to the portion of the conductive material disposed on the feature. The method may also include adjusting a length of the carbon nanotube using joule heating, where the adjusting includes inducing stress in a region of the carbon nanotube to increase an electrical resistance of the region. A current is passed through the carbon nanotube to induce joule heating at the region. The current is adjusted until the joule heating causes the carbon nanotube to break at the region.

In yet another embodiment, an electron gun includes an electron source including a carbon nanotube and a first conductive material electrically coupled to the carbon nanotube, wherein the electron source is operable to emit electrons in response to an application of an electric potential to at least one of the carbon nanotube and the first conductive material. The electron gun also includes an extractor including a second conductive material with an aperture, wherein the extractor is operable to at least one of extract and accelerate electrons emitted from the electron source in response to the application of the electric potential between the second conductive material and at least one of the carbon nanotube and the first conductive material. The electron source includes a first alignment feature and the extractor includes a second alignment feature, and wherein the first and second alignment features are for substantially aligning the carbon nanotube with the aperture. The first and second alignment features may be operable to interface with one another when the extractor is mated with the electron source.

In another embodiment, an array of electron guns includes a first electron gun including a first electron source including a first carbon nanotube, wherein the first electron source is operable to emit electrons in response to an application of an electric potential to the carbon nanotube. A first extractor includes a first conductive material with a first aperture for at least one of extracting and accelerating electrons emitted from the electron source in response to the application of the electric potential between the first conductive material and the first carbon nanotube. The first electron source and the first extractor each comprise at least one alignment feature for substantially aligning the first carbon nanotube with the first aperture. The array of electron guns also includes a second electron gun located in proximity to the first electron gun, where the second electron gun includes a second electron source comprising a second carbon nanotube, wherein the second electron source is operable to emit electrons in response to an application of an electric potential to the carbon nanotube. A second extractor includes a second conductive material with a second aperture for at least one of extracting and accelerating electrons emitted from the electron source in response to the application of the electric potential between the second conductive material and the second carbon nanotube. The second electron source and the second extractor may each comprise at least one alignment feature for substantially aligning the second carbon nanotube with the second aperture.

In yet another embodiment, a method of producing an extractor for an electron gun includes identifying a reference point common to both an electron source and an extractor when the extractor is mated with the electron source. A relative position of a carbon nanotube of said electron source is determined with respect to the reference point. An aperture is then created in a conductive material of the extractor at the relative position with respect to the reference point, wherein the aperture is substantially aligned with the carbon nanotube when the extractor is mated with the electron source. The electron source and the extractor may each comprise at least one alignment feature for maintaining alignment of the electron source and the extractor when mated, and wherein the reference point is associated with the alignment feature. The creating the aperture may include focused ion beam milling the conductive material of the extractor to generate the aperture. Additionally, the method may include fabricating the extractor, where the fabricating may include disposing the conductive material on a substrate and etching the substrate to create at least one alignment feature for aligning the extractor with the electron source.

In another embodiment, a method of providing field emission current using an electron gun includes applying an electric potential between an electron source and an extractor of the electron gun, wherein the electron source and the extractor each comprise at least one respective alignment feature for substantially aligning a carbon nanotube of the electron source with an aperture of the extractor. The method also includes extracting electrons from the carbon nanotube using the extractor to provide the field emission current. The method may also include using the field emission current to perform at least one of electron microscopy, electron-beam metrology, and electron-beam lithography.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Embodiments of the Invention

Figure 1:
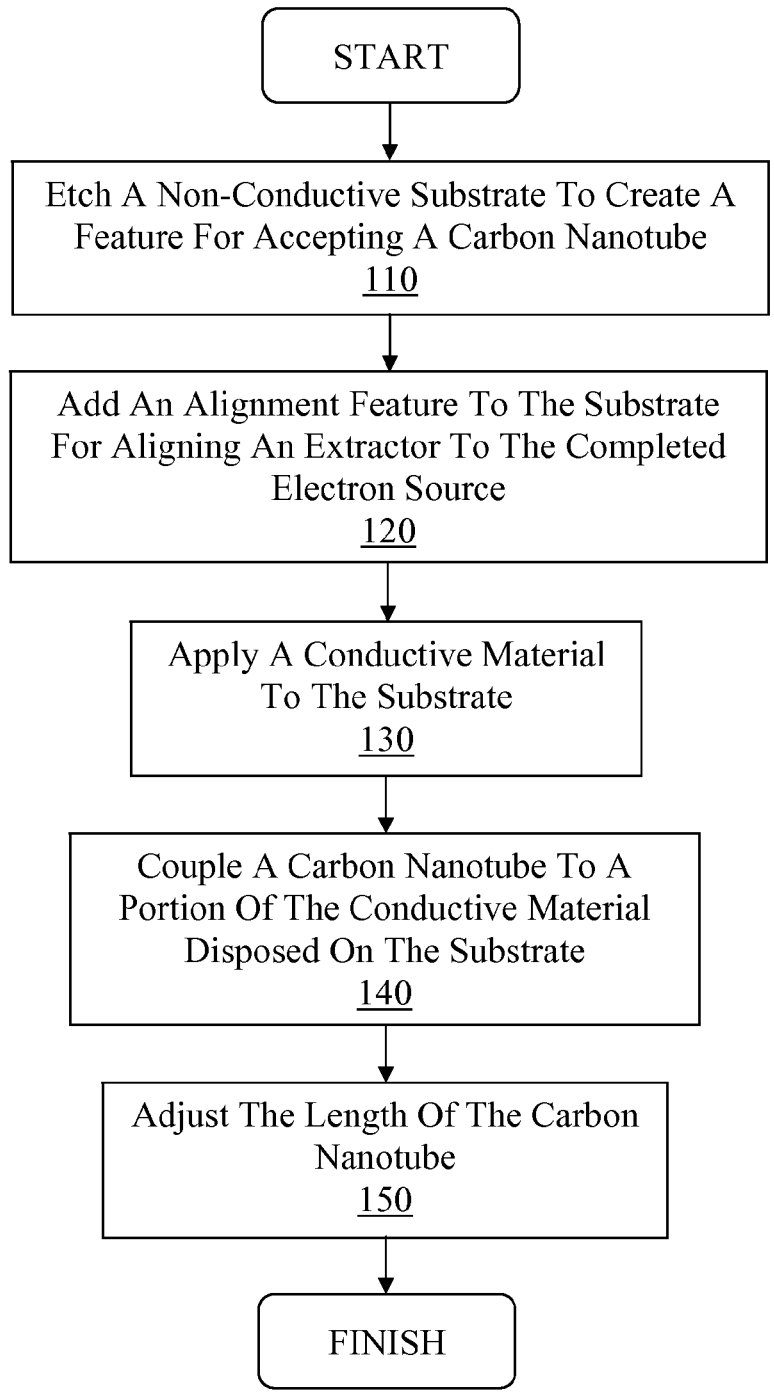
FIG. 1 shows an exemplary process for producing an electron source in accordance with one embodiment of the present invention.
Figure 2A:
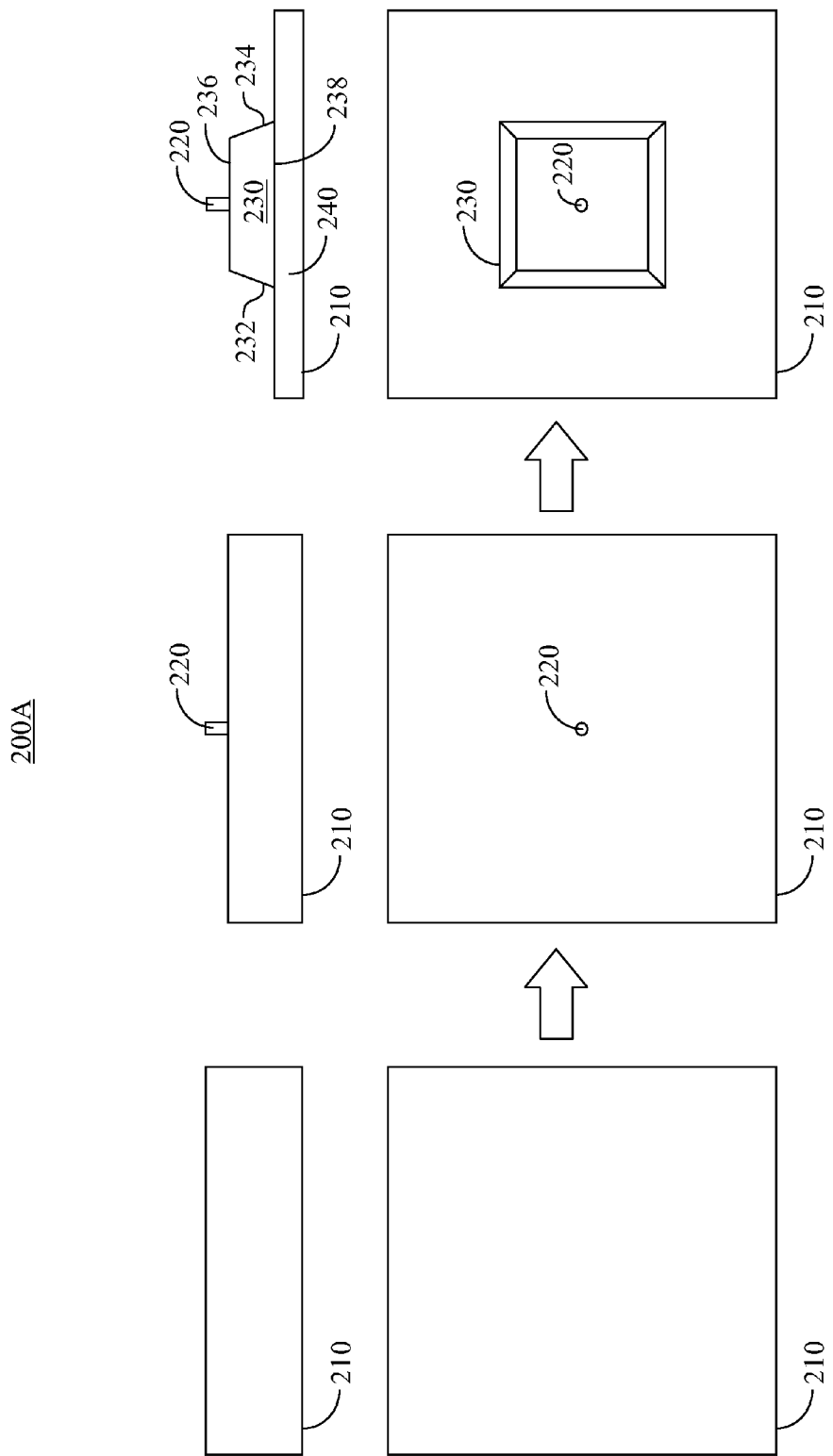
FIG. 2A shows a first set of exemplary production stages of an electron source in accordance with one embodiment of the present invention.
Figure 2B:
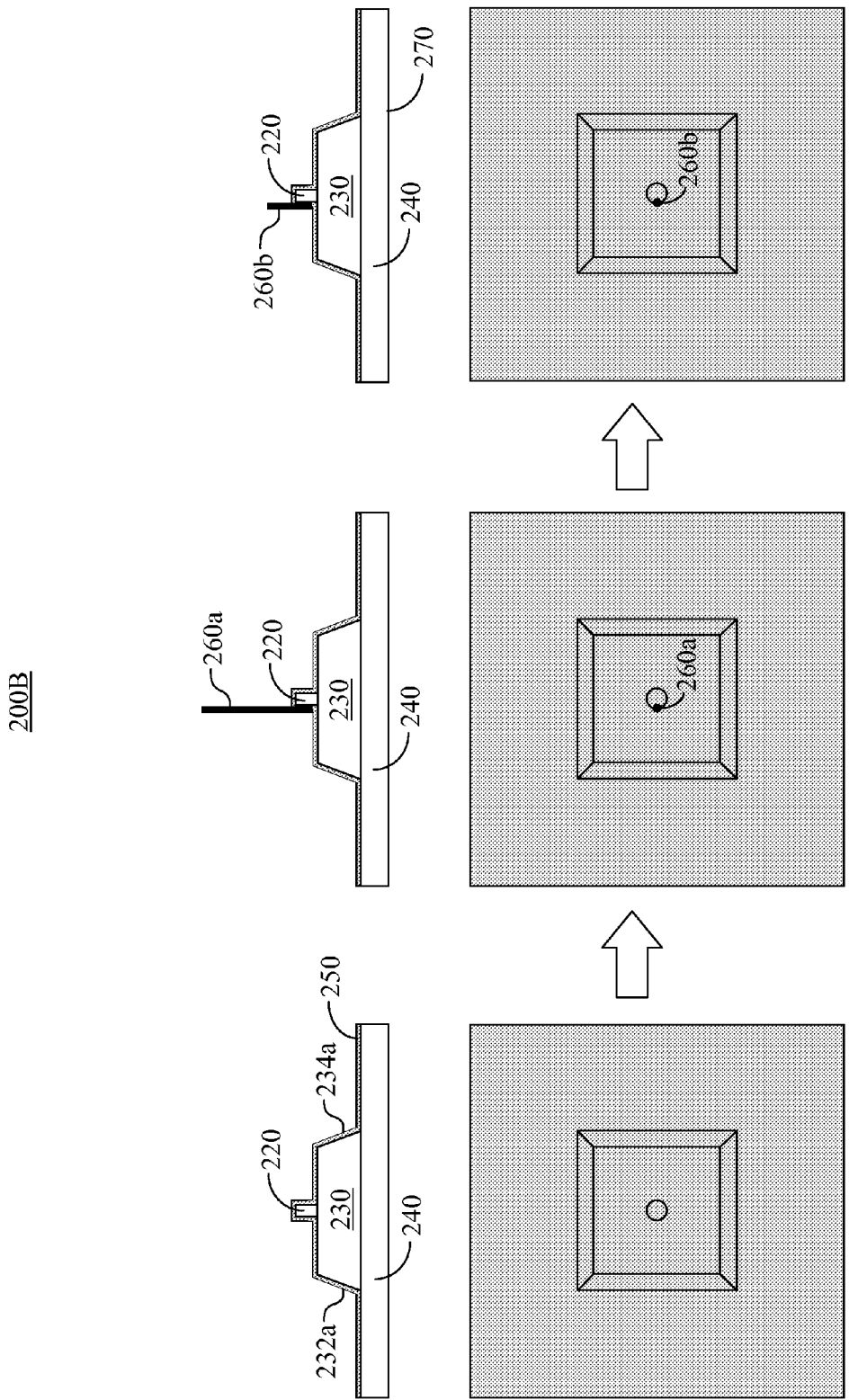
FIG. 2B shows a second set of exemplary production stages of an electron source in accordance with one embodiment of the present invention.

FIG. 1 shows exemplary process 100 for producing an electron source, commonly referred to as a cathode, in accordance with one embodiment of the present invention. FIGS. 2A and 2B show sets 200A and 200B of exemplary production stages of an electron source (e.g., a micro-electro-mechanical-system (MEMS) based electron source) in accordance with one embodiment of the present invention. In one embodiment, the production stages depicted in FIGS. 2A and 2B may correspond with one or more steps of process 100. As such, FIGS. 2A and 2B will be described in conjunction with FIG. 1.

As shown in FIG. 1, step 110 involves etching a substrate to create a feature for accepting a carbon nanotube. For example, as shown in FIG. 2A, substrate 210 may be etched to form feature 220. Substrate 210 may comprise a non-conductive material in one embodiment. Alternatively, substrate 210 may comprise a semi-conductive material, such as silicon (e.g., using a silicon <100> wafer), in another embodiment. Additionally, feature 220 may be formed by appropriately masking substrate 210 and applying an etching process (e.g., a reactive ion etch (RIE)) to etch the unmasked portions.

Feature 220 may be shaped to enable attachment of a carbon nanotube (CNT), and also to provide adequate mechanical and electrical stability for the CNT during operation. Additionally, the dimensions (e.g., length, width, diameter, etc.) of feature 220 may be varied to control emission properties of the CNT. For example, in one embodiment, the size of feature 220 may be increased to increase the turn-on voltage of the CNT, thereby decreasing the electric field at the CNT tip. And in one embodiment, feature 220 may comprise a post having a height and diameter of approximately 70 μm.

As shown in FIG. 1, step 120 involves adding an alignment feature to the substrate for aligning an extractor to the completed electron source. For example, substrate 210 may be further etched in one embodiment to create alignment feature 230 for aligning the electron source to an extractor of an electron gun. The extractor, or any components disposed between the electron source and the extractor in the assembled electron gun, may comprise one or more features for interfacing with feature 230 of the electron source. As such, the electron source may align with the extractor when the electron gun is assembled, thereby substantially aligning the CNT of the electron source with an aperture of the extractor in one embodiment. Thus, the electron gun utilizing the electron source produced in FIGS. 2A and 2B may exhibit improved field emission characteristics, stability, reliability, and durability.

Alignment feature 230 may be formed by appropriately masking substrate 210 and applying an etching solution to etch the unmasked portions. In one embodiment, alignment feature 230 may be formed in accordance with MEMS fabrication technology. The mask applied to substrate 210 may be based upon alignment features of an existing extractor such that feature 230 may appropriately mate with one or more of the alignment features of the extractor after etching. Where substrate 210 comprises silicon (e.g., using a silicon <100> wafer), a KOH wet etch solution (e.g., also comprising water and isopropyl alcohol) may be applied to substrate 210 to form surfaces 232 and 234 of feature 230. Surfaces 232 and 234 may have substantially equal angles (e.g., with respect to base 240 of substrate 210), where the angles may be a result of orientation-dependent etching of substrate 210. In one embodiment, surfaces 232 and 234 may represent 111-planes at approximately 54.7 degrees from the 100-plane. Additionally, in one embodiment, the etching of substrate 210 may produce upper surface 236 with dimensions of approximately 170 μm by 170 μm and bottom surface 238 with dimensions of approximately 300 μm by 300 μm.

Alternatively, alignment feature 230 may comprise a separate object added to substrate 210. For example, feature 230 may comprise any object (e.g., a block, post, etc.) coupled (e.g., bonded, press-fit, etc.) to the substrate for interfacing with a feature (e.g., edge, surface, object coupled to, etc.) of an extractor or any other object disposed between the electron source and the extractor in the assembled electron gun. And in other embodiments, feature 230 may comprise a portion removed from substrate 210 (e.g., to create a hole, etc.), where the removed portion may interface with a feature of the extractor or interfacing object, may enable use of a tool for aligning the electron source and extractor, etc.

As shown in FIG. 1, step 130 involves applying a conductive material to the substrate. For example, conductive material 250 may be applied to feature 220, feature 230, and base 240 as shown in FIG. 2B. The conductive material may comprise a material operable to bond to the substrate material. In one embodiment, where the substrate comprises silicon, conductive material 250 may comprise nickel or another metal operable to form a strong interface with a CNT. Additionally, application of conductive material 250 to feature 230 may create surfaces 232a and 234a which are substantially parallel to respective surfaces 232 and 234 as depicted in FIG. 2A.

Although conductive material 250 is depicted in FIG. 2B to cover almost all of feature 220, feature 230 and base 240, it should be appreciated that conductive material 250 may only cover select regions of the substrate in other embodiments. For example, in one embodiment, material 250 may form a pad (e.g., on feature 220) and an electrode (e.g., disposed on feature 220, feature 230, base 240, or a combination thereof) coupled to the pad for applying an electric potential to the CNT (e.g., to provide field emission current). Additionally, although conductive material 250 is depicted with a consistent thickness in FIG. 2B, it should be appreciated that the thickness of material 250 may vary in other embodiments. Further, it should be appreciated that the elements depicted in FIGS. 2A and 2B may comprise different shapes, sizes, etc. in other embodiments.

As shown in FIG. 1, step 140 involves coupling a CNT to a portion of the conductive material disposed on the substrate. For example, CNT 260a may be coupled to feature 220 and/or a portion of conductive material 250 disposed on feature 220 as shown in FIG. 2B. The CNT (e.g., 260a) may be coupled in a substantially perpendicular orientation with respect to base 240. Additionally, CNT 260a may be chosen based upon one or more physical characteristics (e.g., length, diameter, etc.) to vary or control field emission characteristics (e.g., field enhancement, energy spread, brightness, stability, lifetime, etc.) of the electron source (e.g., produced as a result of process 100) and/or electron gun utilizing the electron source.

Figure 3:
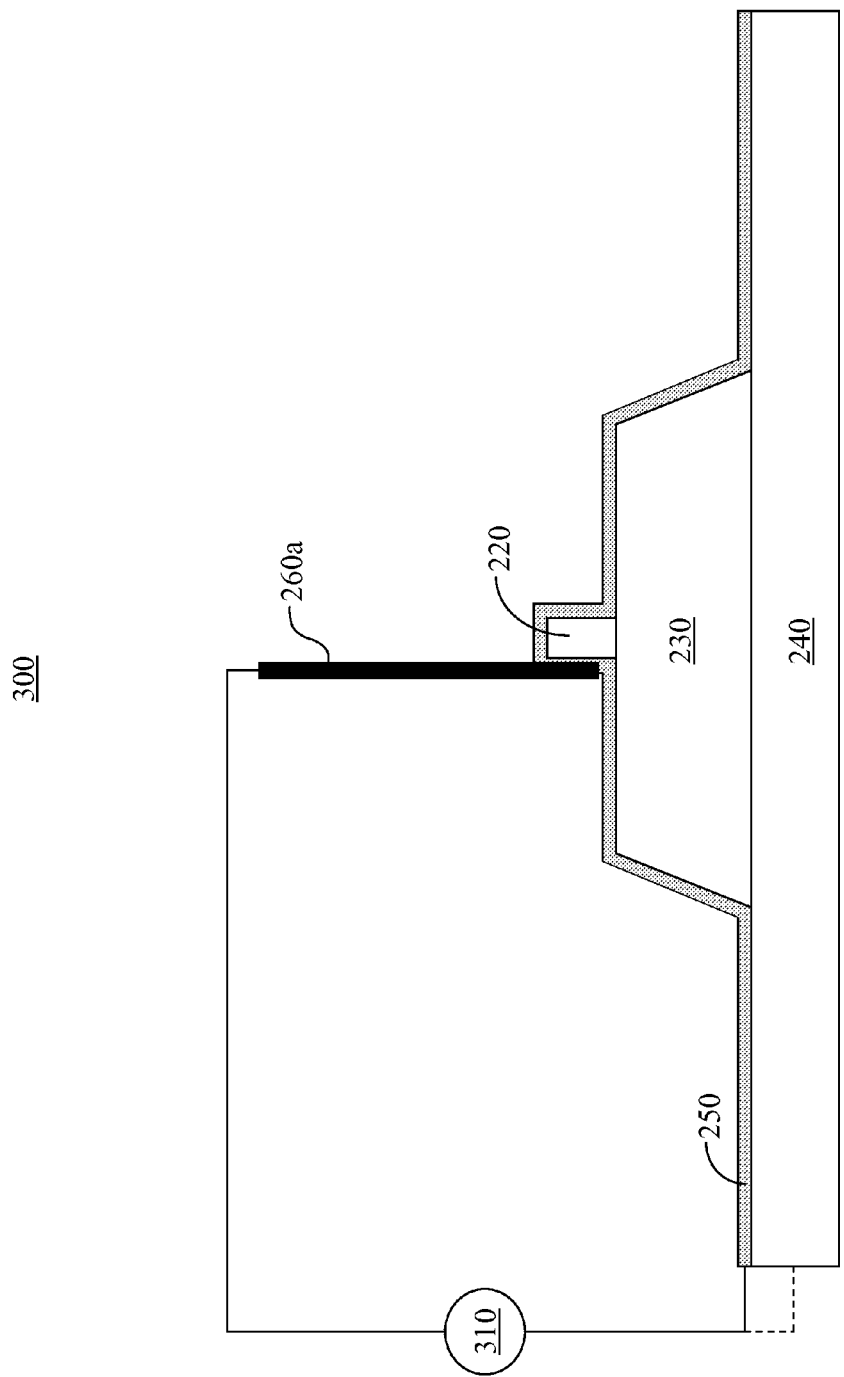
FIG. 3 shows an exemplary setup for coupling a carbon nanotube to a substrate of an exemplary electron source in accordance with one embodiment of the present invention.

The CNT (e.g., 260a) may be coupled by welding the CNT to conductive material (e.g., 250) disposed on the electron source substrate (e.g., 210). In one embodiment, joule heating may be used. For example, as shown in FIG. 3, CNT 260a may be welded to conductive material 250 by applying electric potential 310 to CNT 260a (e.g., the tip of CNT 260a) and conductive material 250 (e.g., forming an electrode coupled to CNT 260a). Alternatively, electric potential 310 may be applied between CNT 260a (e.g., the tip of CNT 260a) and the electron source substrate (e.g., feature 220, feature 230, base 240, etc.) as indicated by the dashed lines. Sufficient heat may be generated by the electrical resistance between the CNT (e.g., 260a) and the conductive material (e.g., 250) to bond the CNT and the conductive material. In other embodiments, other forms of welding and/or bonding may be used to couple CNT to feature 220 and/or conductive material 250 disposed thereon.

Step 150 involves adjusting the length of the CNT. For example, as shown in FIG. 2B, CNT 260a may be shortened to form CNT 260b. The length of the CNT may be adjusted by cutting, shearing, breaking, joule heating (e.g., in accordance with process 400 of FIG. 4), etc. Additionally, any length-adjusting procedure used to adjust the length of the CNT (e.g., 260a, 260b, etc.) may be repeated to further adjust the length. As such, completed electron source 270 may be produced upon adjusting the CNT (e.g., 260a) to a predetermined length (e.g., as represented by CNT 260b). In one embodiment, CNT 260b may have a length of approximately 3 µm. It should be appreciated that step 150 may be optional where the CNT (e.g., 260a) is of a desired length upon coupling it to the substrate (e.g., feature 220) and/or conductive material (e.g., 250) disposed thereon.

Figure 4:
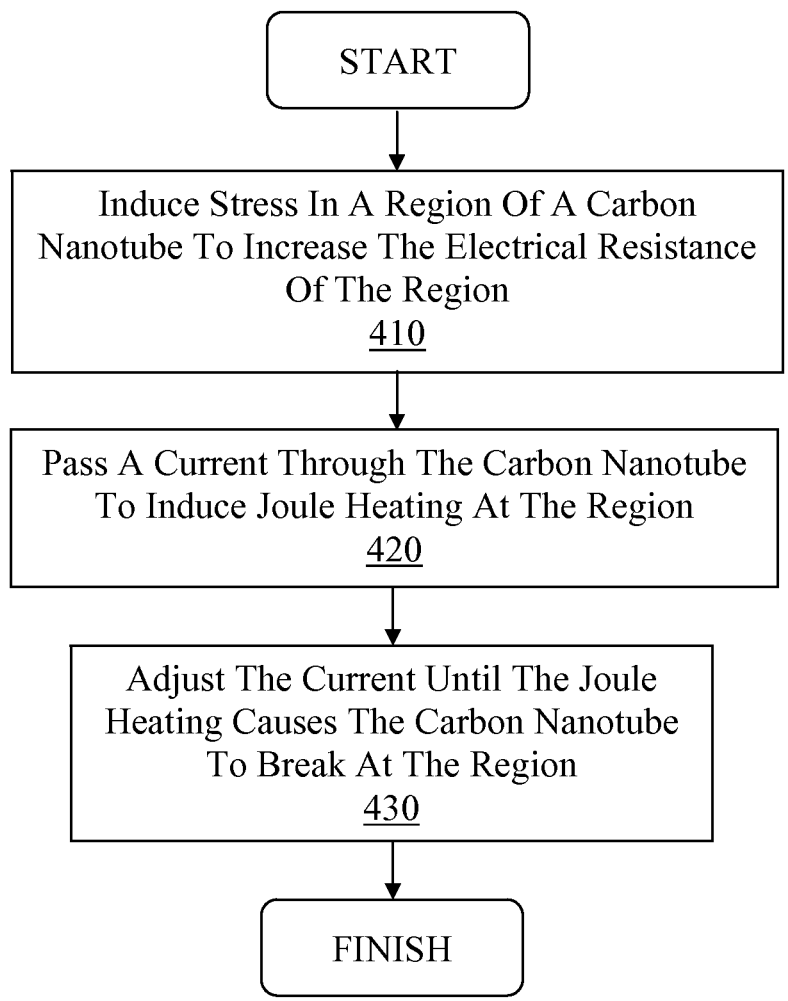
FIG. 4 shows an exemplary process for adjusting the length of a carbon nanotube in accordance with one embodiment of the present invention.

FIG. 4 shows exemplary process 400 for adjusting the length of a carbon nanotube in accordance with one embodiment of the present invention. As shown in FIG. 4, step 410 involves inducing stress in a region of a CNT to increase the electrical resistance of the region. For example, CNT 260a of FIG. 2B may be bent, twisted, or otherwise strained to induce stress in a select region of the CNT. The region may be located at a point along the CNT to which the CNT is to be shortened. As such, the electrical resistance of the region may be increased given the stresses induced in that region.

Step 420 involves passing a current through the CNT to induce joule heating at the region. The current may be passed through the CNT by applying an electric potential across the CNT, or between a tip of the CNT and an electrode coupled to the CNT. In one embodiment, the region in which stress was induced in step 410 may produce more heat than surrounding regions of the CNT (e.g., 260a) given the relatively higher resistance of the region with respect to the surrounding regions (e.g., in which stresses were not induced). An inert and conductive material (e.g., gold) may be used to contact the CNT and pass the current, thereby reducing the bonding between the CNT and the material during the heating.

As shown in FIG. 4, step 430 involves adjusting (e.g., increasing) and/or maintaining the current until the joule heating causes the CNT to break at the region. The region (e.g., that in which stress was induced in step 410) may heat to a point such that the CNT (e.g., 260a) degrades at the region, thereby causing the CNT to break and form a shortened CNT (e.g., 260b). In one embodiment, the break at the region may produce a shortened CNT (e.g., 260b) with a sharp (e.g., pointed, convex, etc.) emitter tip. Additionally, although the CNT may be shortened in step 430, the CNT may still maintain a high aspect ratio (e.g., length to diameter) in one embodiment. Further, in one embodiment, process 400 may produce a CNT (e.g., 260b) with a length resolution of +/−500 nm.

As such, embodiments provide convenient and effective means for varying characteristics of the CNT (e.g., length, diameter, tube aspect ratio, etc.) to control field emission characteristics (e.g., field enhancement, energy spread, brightness, stability, lifetime, etc.) of the electron source and/or electron gun utilizing the electron source. Additionally, varying the CNT properties may also adjust the geometry or other characteristics of the electron gun utilizing the electron source, thereby enabling further control over field emission characteristics. For example, the length of the CNT may be used to control the distance between the CNT tip and the extractor in an assembled electron gun, where a longer CNT may equate to a shorter distance between the CNT tip and the extractor.

Figure 5:
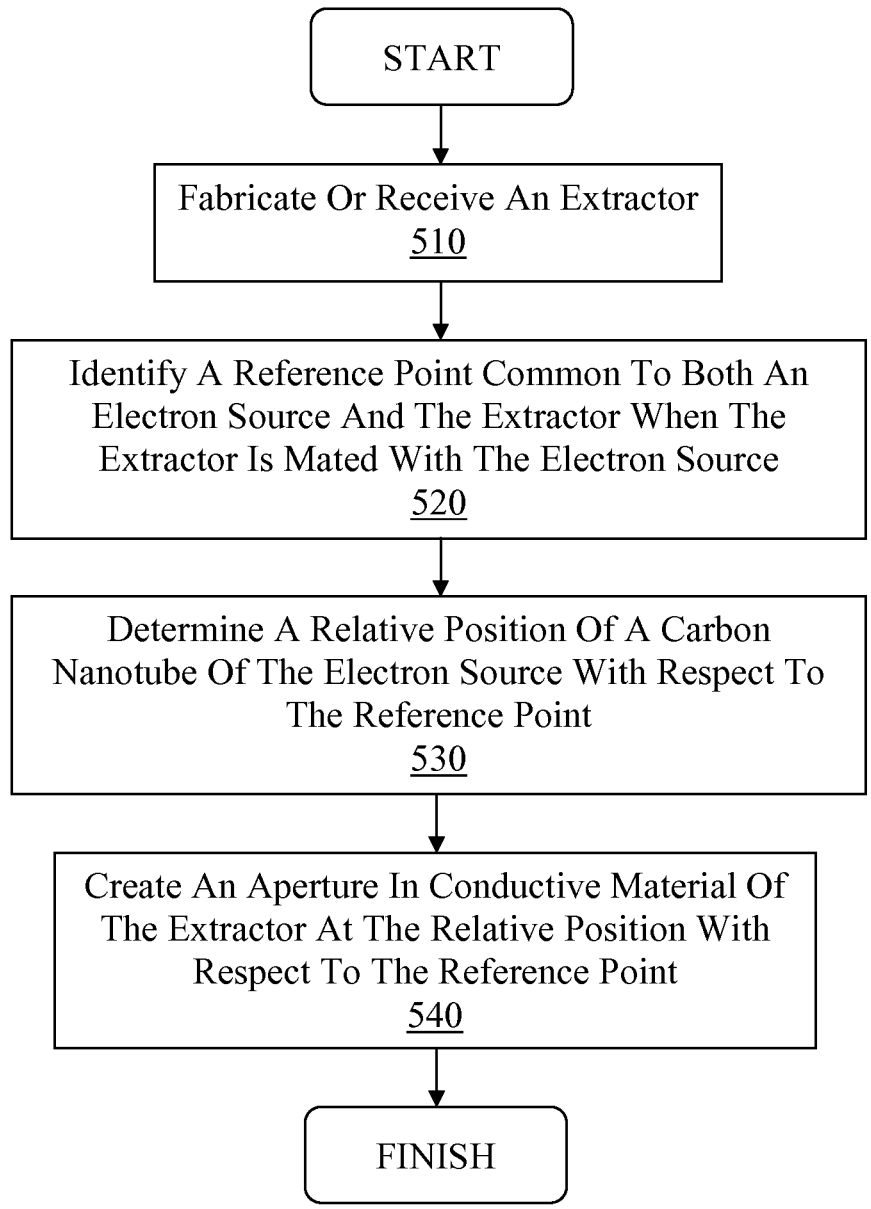
FIG. 5 shows an exemplary process for producing an extractor for an electron gun in accordance with one embodiment of the present invention.

FIG. 5 shows exemplary process 500 for producing an extractor for an electron gun in accordance with one embodiment of the present invention. As shown in FIG. 5, step 510 involves fabricating or receiving an extractor. An extractor received in step 510 may be pre-fabricated, either for use in electron guns or other applications. Alternatively, an extractor comprising a non-uniform substrate (e.g., as shown in FIG. 6A below) or a uniform substrate (e.g., as shown in FIG. 6B below) may be fabricated or received in step 510.

Figure 6:
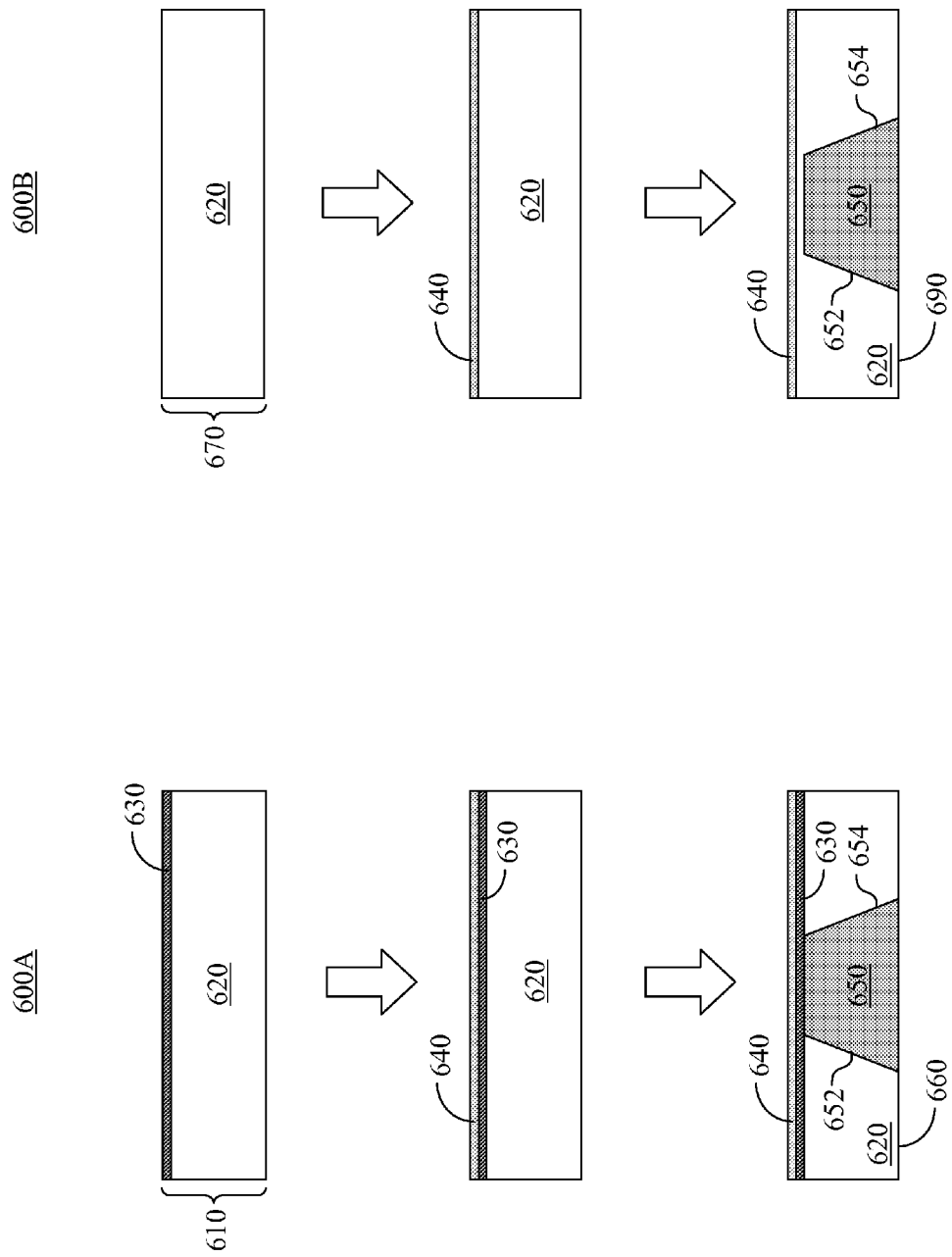
FIG. 6A shows a set of exemplary production stages of an electron gun extractor with a non-uniform substrate in accordance with one embodiment of the present invention.
FIG. 6B shows a set of exemplary production stages of an electron gun extractor with a uniform substrate in accordance with one embodiment of the present invention.

Turning briefly to FIGS. 6A and 6B, FIG. 6A shows set 600A of exemplary production stages of an electron gun extractor with a non-uniform substrate in accordance with one embodiment of the present invention, whereas FIG. 6B shows set 600B of exemplary production stages of an electron gun extractor with a uniform substrate in accordance with one embodiment of the present invention. As shown in FIG. 6A, non-uniform substrate 610 comprises membrane 630 disposed on substrate material 620. In one embodiment, substrate material 620 may comprise silicon. In another embodiment, substrate material 620 may comprise a metal (e.g., where an insulating structure is used to substantially insulate the extractor from the electron source). Membrane 630 may comprise $Si_3N_4$, which may have a thickness of 200 nm in one embodiment.

Conductive material 640 may be disposed on membrane 630, where material 640 may comprise metal in one embodiment. Material 640 may form an extractor electrode for applying an electric potential (e.g., which may also be applied to a CNT electrode), where the electric potential may be used to provide field emission current from an electron gun utilizing extractor 660.

As shown in FIG. 6A, feature 650 may be created in substrate material 620. Feature 650 may comprise a recess for accepting one or more portions of an electron source (e.g., CNT 260b, feature 220 and feature 230 of FIG. 2B), where surfaces 652 and 654 may form locating features for interfacing with features (e.g., surfaces 232, 234, 232a, 234a, etc.) of the electron source (e.g., 270) and/or features of an object disposed between the electron source (e.g., 270) and the extractor (e.g., 660). As such, surfaces 652 and 654 may align or locate extractor 660 with respect to an electron source (e.g., 270) when they are mated (e.g., coupled directly, coupled with one or more other components coupled between portions of the extractor and electron source, etc.).

In one embodiment, an angular relationship between surfaces 652 and 654 may be substantially equal to an angular relationship between alignment features (e.g., surfaces 232, 234, 232a, 234a, etc.) of a mating electron source. The angular relationship may be created by using a similar substrate material for both the electron source alignment features (e.g., surfaces 232, 234, 232a, 234a, etc.) and the extractor alignment features (e.g., surfaces 652, 654, etc.), where the substrate material (e.g., 620) comprises a material (e.g., silicon <100>) that is amenable to an orientation-dependent etch (e.g., using a mixture of KOH, water and isopropyl alcohol). Additionally, membrane 630 may be substantially resistant to the etching in one embodiment, thereby forming a barrier between the substrate to be etched (e.g., substrate material 620) and the conductive material (e.g., 640) disposed on membrane 630. In other embodiments, other methods (e.g., non-orientation-dependent etching, focused ion beam milling, etc.) may be used to produce a similar angular relationship between alignment features of the electron gun and the extractor.

As shown in FIG. 6B, uniform substrate 670 comprises substrate material 620. Conductive material 640 may be disposed directly on substrate material 620 in one embodiment. Additionally, similar to the discussion with respect to FIG. 6A, feature 650 may be formed in substrate material 620, where feature 650 may accept one or more portions of an electron source (e.g., CNT 260b, feature 220 and feature 230 of FIG. 2B) mated with extractor 690, form alignment features (e.g., surfaces 652 and/or 654) for aligning an electron source to extractor 690, etc.

Although FIGS. 6A and 6B depict feature 650 with specific shapes, it should be appreciated that the features (e.g., 650) may be alternatively shaped in other embodiments. Additionally, although surfaces (e.g., 652, 654, etc.) of the features are described as locating or alignment features, it should be appreciated that extractor 660 and/or 690 may comprise alternative or additional alignment features in other embodiments. Further, it should be appreciated that the alternative and/or additional alignment features may be formed by adding to and/or removing material from the extractors (e.g., 660 and/or 690).

Figure 7:
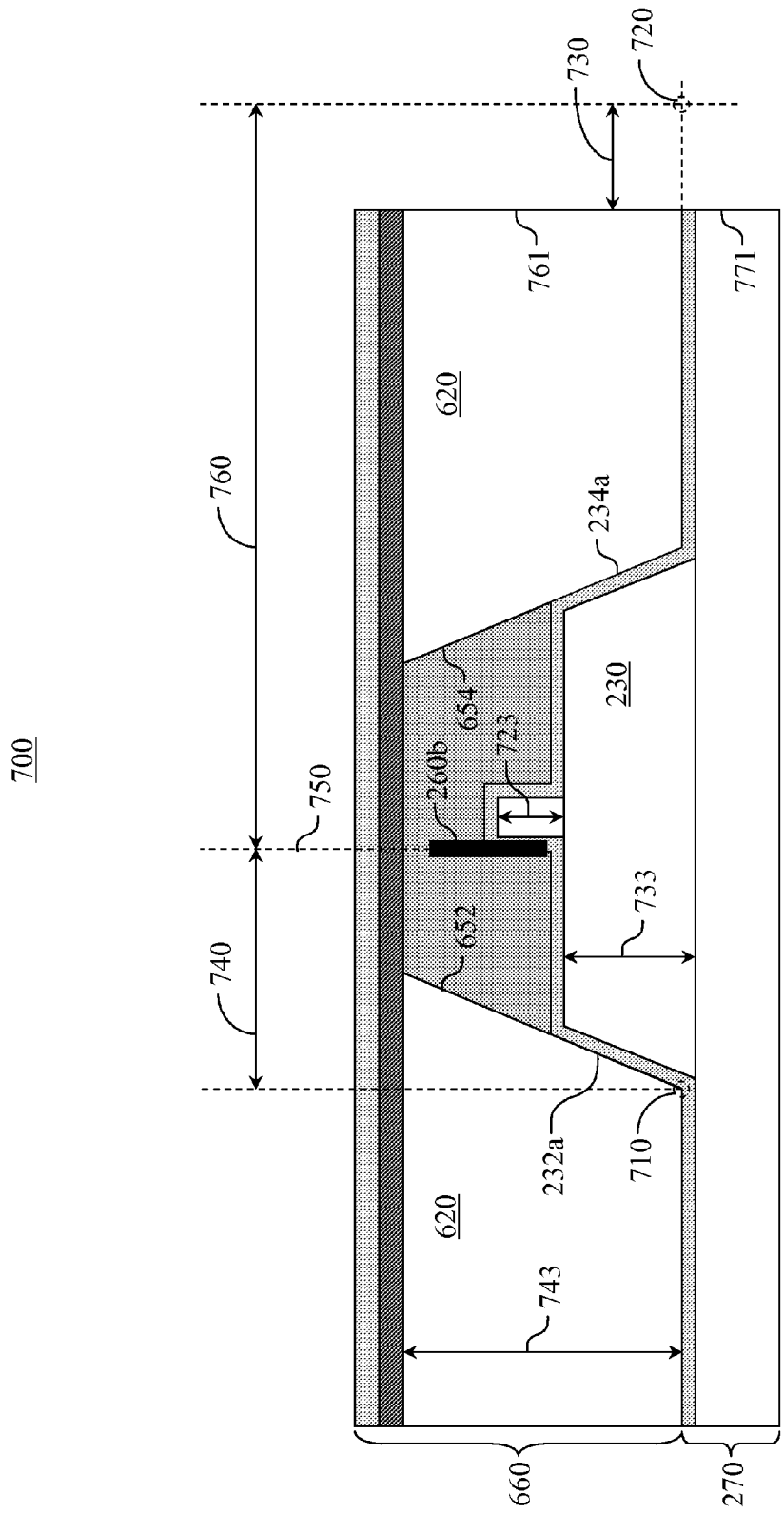
FIG. 7 shows an assembled view of an exemplary electron gun prior to creating an aperture in the extractor in accordance with one embodiment of the present invention.

Referring back to FIG. 5, step 520 involves identifying a reference point common to both an electron source and the extractor when the extractor is mated to the electron source. As shown in FIG. 7, assembled electron gun 700 comprises extractor 660 mated to electron source 270, where the extractor and the electron source may share common reference point 710. The common reference point may be located at a point, line or surface of the extractor (e.g., 660) and/or the electron source (e.g., 270) in one embodiment. Alternatively, a reference point may be common to both the extractor and the electron source if the reference point is identifiable with respect to both the extractor and the electron source individually. For example, reference point 720 may be used as a common reference point since it is identifiable with respect to extractor 660 (e.g., a distance 730 away from surface 761 of extractor 660) and with respect to electron source 270 (e.g., a distance 730 away from surface 771 of electron source 270).

As shown in FIG. 5, step 530 involves determining a relative position of a CNT of the electron source (e.g., 270) with respect to the reference point (e.g., determined in step 520). As shown in FIG. 7, relative position 740 of CNT 260b (e.g., axis 750) may be determined with respect to reference point 710. Alternatively, relative position 760 of CNT 260b (e.g., axis 750) may be determined with respect to reference point 720. In one embodiment, an electron microscope (e.g., a scanning electron microscope) may be used to determine the relative position of the CNT (e.g., 260b) with respect to the reference point (e.g., 710, 720, etc.).

Figure 8:
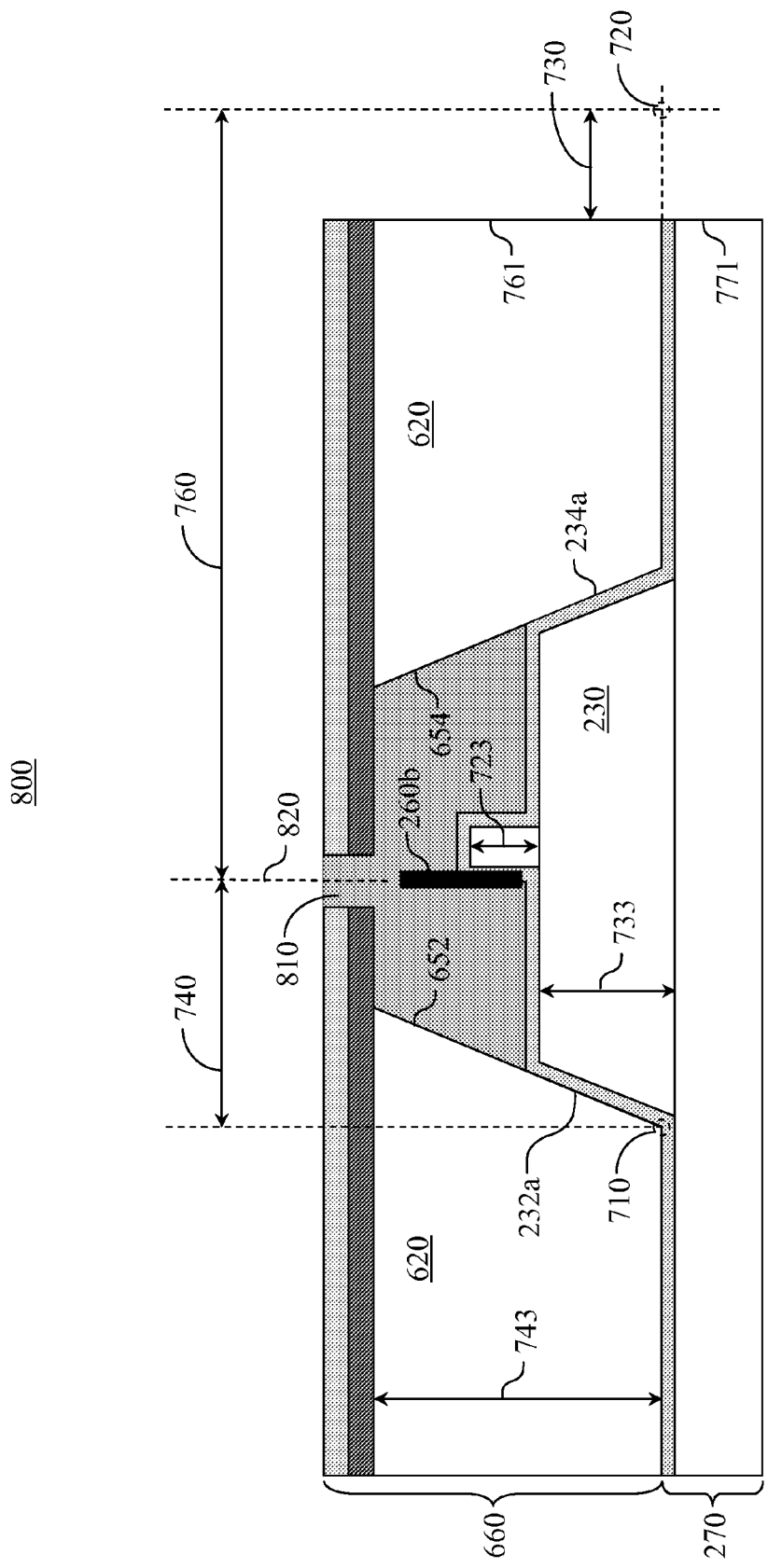
FIG. 8 shows an assembled view of an exemplary electron gun with an aperture in the extractor in accordance with one embodiment of the present invention.

After a relative position is determined, an aperture may be created in the conductive material of the extractor in step 540 at the relative position (e.g., determined in step 530) with respect to the reference point. For example, as shown in FIG. 8, aperture 810 may be created along axis 820 of electron gun 800, where axis 810 may be located at a relative position (e.g., 740, 760, etc.) with respect to a reference point (e.g., 710, 720, etc.). As such, in one embodiment, aperture 810 may share an axis (e.g., 820) with CNT 260b (e.g., 750).

Further, it should be appreciated that process 800 enables aperture 810 to be substantially aligned with the CNT (e.g., 260b) regardless of the location and/or orientation of the CNT mounting in the electron source (e.g., 270), thereby enabling the use of more lenient CNT alignment tolerances when manufacturing the electron source. Thus, embodiments can reduce the cost and time associated with manufacturing the electron sources (e.g., 270) and/or electron guns (e.g., 800), as well as reducing the failure rate of the manufactured electron sources and/or electron guns. Further, by improving the alignment of the CNT (e.g., 260b) with the extractor (e.g., extractor aperture 810), embodiments enable the use of the smaller and less-expensive focusing electron optics. And in other embodiments, focusing electron optics may not be required given the alignment of the CNT (e.g., 260b) with the extractor aperture (e.g., 810)

Aperture 820 may be created in conductive material 640 and/or membrane 630 by using focused ion beam milling in one embodiment. The aperture may have a diameter ranging from approximately 20 nm to hundreds of microns in one embodiment. Although aperture 810 is depicted in FIG. 8 as a straight, round hole, it should be appreciated that aperture 810 may be alternatively shaped in other embodiments.

Accordingly, embodiments provide convenient and effective mechanisms (e.g., surfaces 652/654 and surfaces 232a/234a) for aligning a CNT (e.g., 260b) of an electron source (e.g., 270) with an extractor aperture (e.g., 810), thereby increasing the field emission characteristics and overall system stability of the electron gun during operation. Additionally, the geometry or other characteristics of the electron gun (e.g., by varying the length of CNT 260b as discussed above with respect to prior figures, by varying the position of CNT 260b on feature 220, by varying height 723 of feature 220, by varying height 733 of feature 230, by varying height 743 of substrate material 620, etc.) may be varied to further control field emission characteristics. Further, it should be appreciated that one or more components, objects, etc. (e.g., an alignment component for aligning the extractor and electron source, an interface component for further adjusting the geometry and/or configuration of electron gun 800, etc.) may be disposed between extractor 660 and 270 in other embodiments.

Figure 9:
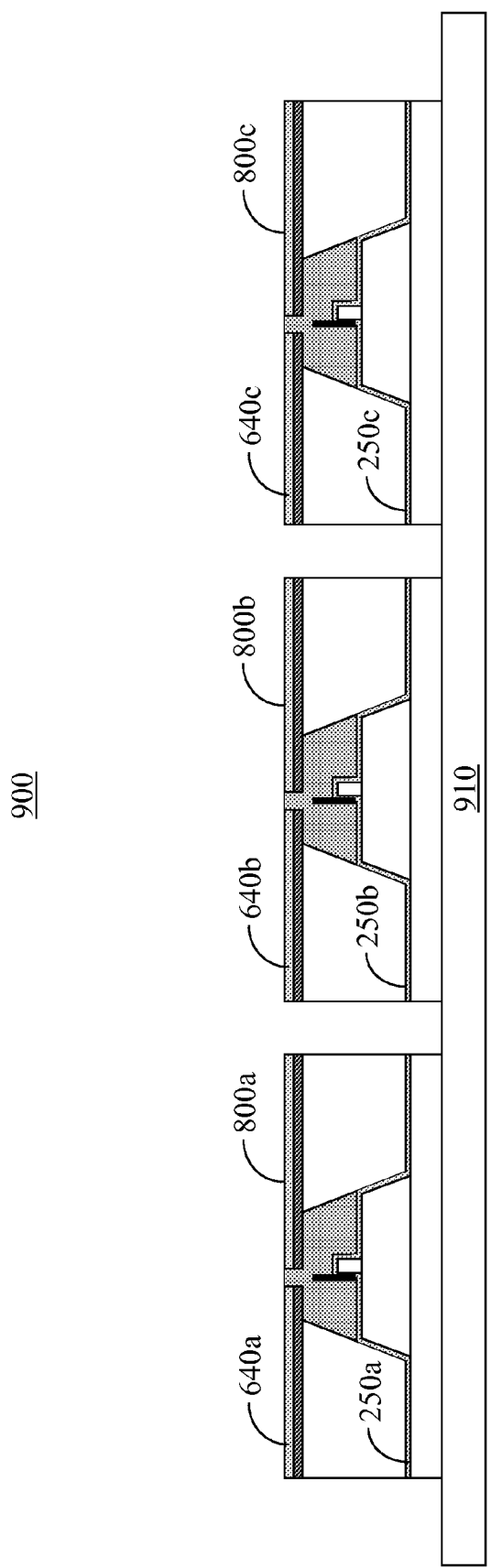
FIG. 9 shows an exemplary array of electron guns in accordance with one embodiment of the present invention.

FIG. 9 shows exemplary array 900 of electron guns in accordance with one embodiment of the present invention. As shown in FIG. 9, electron guns 800a-800c are arranged on substrate 910. In one embodiment, electron guns 800a-800c may be coupled to substrate 910. Alternatively, electron guns 800a-800c may be formed from a common substrate (e.g., 910).

In one embodiment, at least one CNT electrode (e.g., comprising or coupled to conductive material 250a-250c) of electron guns 800a-800c may be coupled together to provide field emission current from a shared electric potential applied to the coupled electrodes. Similarly, at least one extractor electrode (e.g., comprising or coupled to conductive material 640a-640c) of electron guns 800a-800c may be coupled together to provide field emission current from a shared electric potential applied to the coupled electrodes.

In other embodiments, electron guns 800a-800c may be controlled independent of one another. For example, separate electric potentials may be applied to one or more of the electron guns (e.g., 800a, 800b, 800c, etc.), where the separate electric potentials may be applied simultaneously and/or sequentially. In one embodiment, the separate electric potentials may comprise different magnitudes.

Although FIG. 9 shows only three electron guns (e.g., 800a-800c) in array 900, it should be appreciated that array 900 may comprise a greater or smaller number of electron guns in other embodiments. Additionally, it should be appreciated that the electrons guns of array 900 may be arranged in a one-dimensional array, two-dimensional array and/or a three-dimensional array in other embodiments. Further, it should be appreciated that one or more electron guns of array 900 may comprise different characteristics, operating parameters, configurations, etc. in other embodiments.

Figure 10:
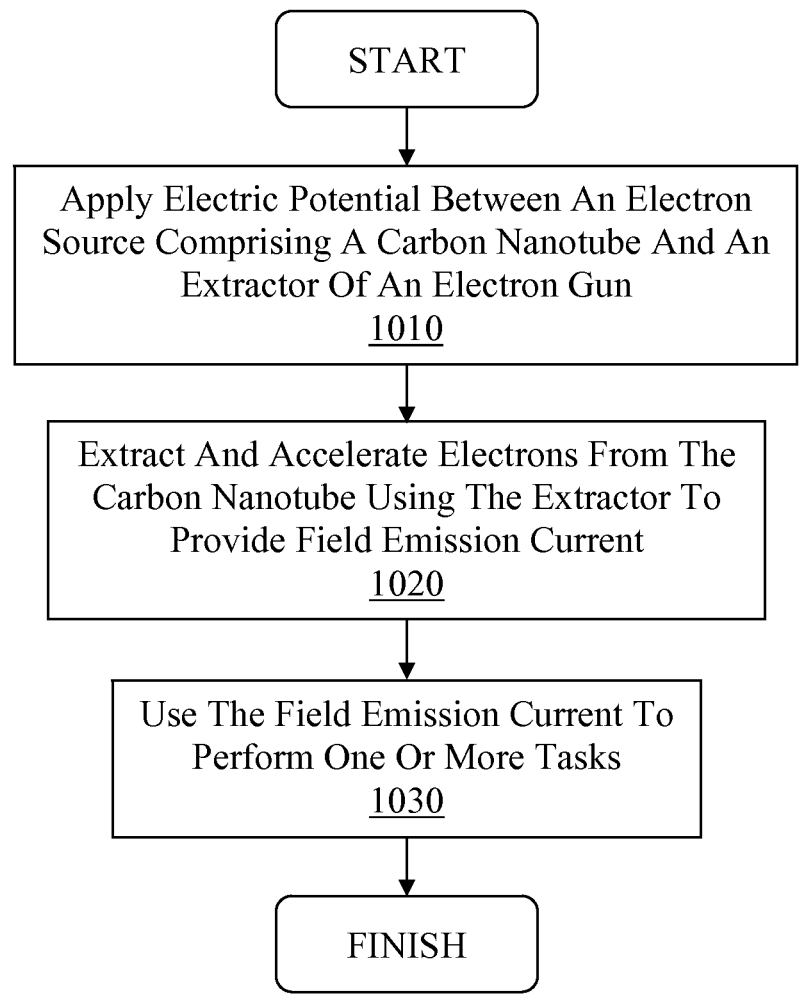
FIG. 10 shows an exemplary process for providing field emission current using an electron gun in accordance with one embodiment of the present invention.
Figure 11:
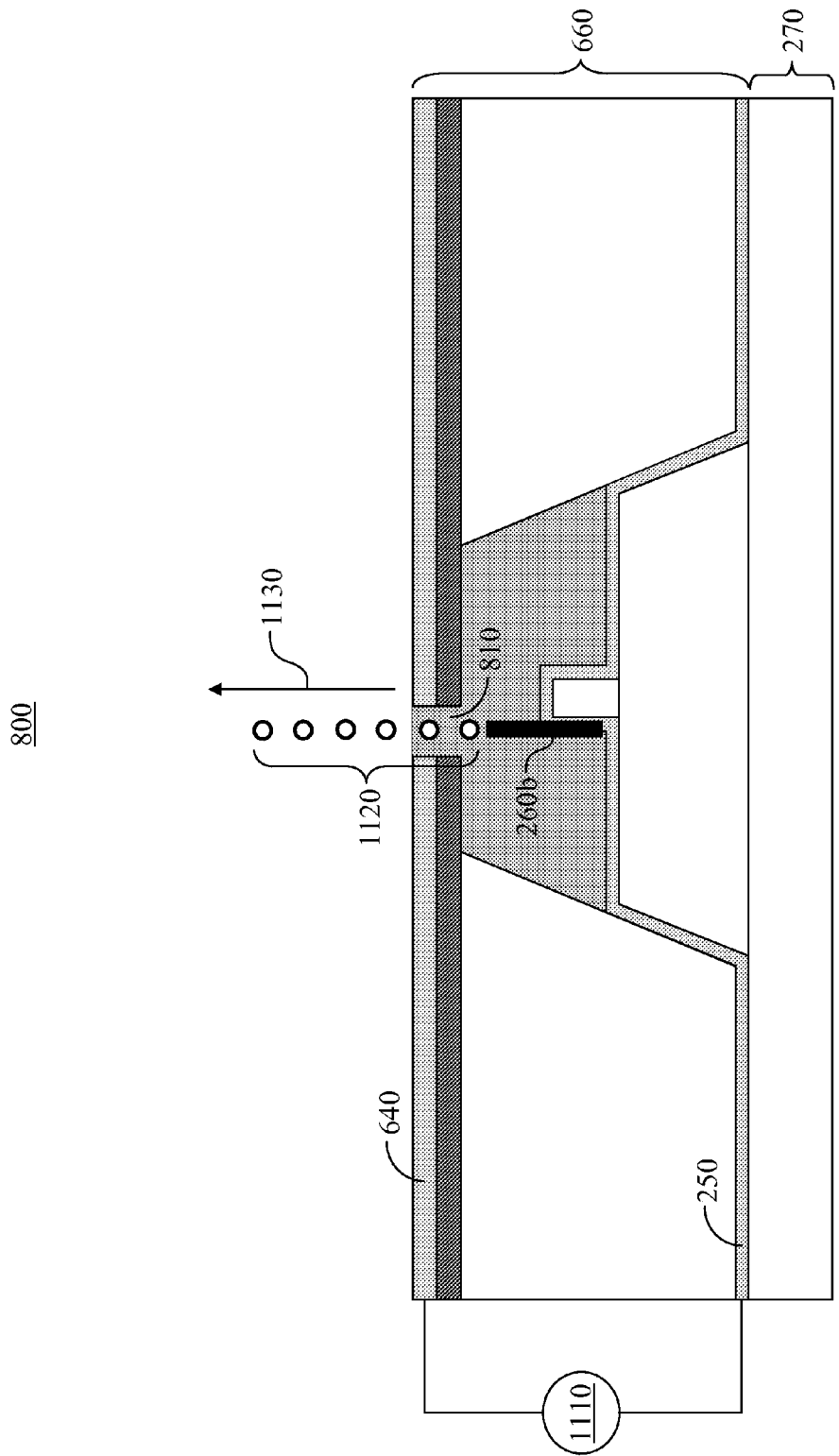
FIG. 11 shows exemplary field emission from an exemplary electron gun in accordance with one embodiment of the present invention.

FIG. 10 shows exemplary process 1000 for providing field emission current using an electron gun in accordance with one embodiment of the present invention. FIG. 11 shows exemplary field emission from exemplary electron gun 800 in accordance with one embodiment of the present invention. In one embodiment, electron gun 800 as depicted in FIG. 11 (and also depicted in FIG. 8) may be used for providing field emission current in accordance with process 1000. As such, FIG. 11 will be described in conjunction with FIG. 10.

As shown in FIG. 10, step 1010 involves applying an electric potential between an electron source comprising a CNT and an extractor of an electron gun. As shown in FIG. 11, electric potential 1110 may be applied between an extractor electrode (e.g., conductive material 640) and a CNT electrode (e.g., 250) of electron gun 800. In one embodiment, electric potential 1110 may range from approximately 10 volts to hundreds of volts Extractor 660 may be mated to electron source 270 (comprising CNT 260*b*) to form electron gun 800. The extractor (e.g., 660) and electron source (e.g., 270) may be mated directly as depicted in FIG. 11, or alternatively, may have at least one other component disposed between the two (e.g., an alignment component for aligning the extractor and electron source, an interface component for further adjusting the geometry and/or configuration of electron gun 800, etc.).

After the electric potential is applied to the electron gun (e.g., 800), electrons may be extracted and accelerated from the CNT using the extractor to provide the field emission current in step 1020. As shown in FIG. 11, electric potential 1110 applied between CNT 260*b* (e.g., coupled to the CNT electrode formed by conductive material 250) and the conductive material (e.g., 640) of the extractor (e.g., 660) may cause CNT 260*b* to emit electrons 1120 which may then be accelerated from electron gun 800 through aperture 810 (e.g., in the direction indicated by arrow 1130).

As discussed above, the characteristics of the field emission current provided by electron gun 800 may depend on the characteristics of electron source 270, extractor 660, the configuration or geometry of the electron source with respect to the extractor, or a combination thereof. As such, the field emission characteristics of electron gun 800 may be conveniently and effectively controlled by varying characteristics of electron source 270 (e.g. the aspect ratio of CNT 260*b*). Alternatively, characteristics of extractor 660 (e.g., the location, size, shape, etc. of aperture 810) may be varied to change the field emission characteristics of electron gun 800. And in other embodiments, the configuration or geometry (e.g., the distance between the CNT tip and the extractor, etc.) of the electron source with respect to the extractor may be varied to change the field emission characteristics.

As shown in FIG. 11, step 1130 involves using the field emission current to perform one or more tasks. In one embodiment, electron gun 800 may be used in electron microscopy. Alternatively, field emission current from electron gun 800 may be used in applications such as electron-beam metrology or electron-beam lithography (e.g., with an array of electron guns providing relatively high throughput).

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A method of producing an electron source, said method comprising:
    etching a substrate to create a feature for accepting a carbon nanotube;
    applying a conductive material to said substrate;
    coupling said carbon nanotube to a portion of said conductive material disposed on said feature; and
    adjusting a length of said carbon nanotube using joule heating.

2. The method of claim 1, wherein said coupling further comprises:
    applying an electric potential between said carbon nanotube and said conductive material; and
    welding said carbon nanotube to said portion of said conductive material disposed on said feature.

3. The method of claim 1, wherein the substrate is nonconductive and said carbon nanotube is coupled in a substantially perpendicular orientation with respect to a base of said nonconductive substrate.

4. The method of claim 1, wherein said substrate is nonconductive and said non-conductive substrate comprises silicon.

5. The method of claim 1, wherein said conductive material comprises at least one of nickel and a metal operable to form a strong interface with a carbon nanotube.

6. The method of claim 1, wherein said substrate comprises at least one alignment feature for aligning said carbon nanotube with an extractor aperture of an electron gun.

7. The method of claim 1, wherein said adjusting said length further comprises:
    inducing stress in a region of said carbon nanotube to increase an electrical resistance of said region;
    passing a current through said carbon nanotube to induce joule heating at said region; and
    adjusting said current until said joule heating causes said carbon nanotube to break at said region.

8. A method of producing an electron source, said method comprising:
    etching a substrate to create a feature for accepting a carbon nanotube;
    applying a conductive material to said substrate;
    coupling said carbon nanotube to a portion of said conductive material disposed on said feature; and
    adjusting a length of said carbon nanotube using joule heating;
    in which adjusting said length further comprises:
        inducing stress in a, region of said carbon nanotube to increase an electrical resistance of said region;
        passing a current through said carbon nanotube to induce joule heating at said region; and
        adjusting said current until said joule heating causes said carbon nanotube to break at said region.

* * * * *